US008694862B2

(12) United States Patent
Sazeides et al.

(10) Patent No.: US 8,694,862 B2
(45) Date of Patent: Apr. 8, 2014

(54) DATA PROCESSING APPARATUS USING IMPLICIT DATA STORAGE DATA STORAGE AND METHOD OF IMPLICIT DATA STORAGE

(75) Inventors: Yiannakis Sazeides, Nicosla (CY); Emre Özer, Cambridge (GB); Daniel Kershaw, Cambridge (GB); Jean-Baptiste Brelot, Anibae (FR)

(73) Assignee: ARM Limited, Cambridge (GB)

( * ) Notice: Subject to any disclaimer, the term of this patent is extended or adjusted under 35 U.S.C. 154(b) by 152 days.

(21) Appl. No.: 13/451,728

(22) Filed: Apr. 20, 2012

(65) Prior Publication Data

US 2013/0283115 A1 Oct. 24, 2013

(51) Int. Cl.

| | |
|---|---|
| ***G11C 29/00*** | (2006.01) |
| ***G06F 11/00*** | (2006.01) |
| ***H03M 13/00*** | (2006.01) |

(52) U.S. Cl.

USPC ........... 714/766; 714/703; 714/752; 714/753; 714/758; 714/763; 714/769; 714/777; 714/799

(58) Field of Classification Search

USPC ......... 714/703, 766, 752, 753, 763, 764, 768, 714/769, 777, 799, 758

See application file for complete search history.

(56) References Cited

U.S. PATENT DOCUMENTS

| | | | | |
|---|---|---|---|---|
| 4,982,401 | A * | 1/1991 | Box | 714/701 |
| 5,761,221 | A * | 6/1998 | Baat et al. | 714/767 |
| 5,768,294 | A * | 6/1998 | Chen et al. | 714/766 |
| 5,958,079 | A * | 9/1999 | Yoshimura | 714/766 |
| 6,047,396 | A * | 4/2000 | Hillis | 714/763 |
| 6,938,193 | B1 * | 8/2005 | Honda | 714/720 |
| 7,203,890 | B1 * | 4/2007 | Normoyle | 714/768 |
| 7,263,649 | B2 * | 8/2007 | Gan et al. | 714/766 |
| 7,272,775 | B2 * | 9/2007 | Jacquet et al. | 714/766 |
| 7,320,096 | B2 * | 1/2008 | Tsao | 714/718 |
| 7,340,665 | B2 * | 3/2008 | Tsang | 714/766 |
| 7,613,982 | B2 * | 11/2009 | Kim et al. | 714/766 |
| 7,676,730 | B2 * | 3/2010 | Haugan et al. | 714/769 |
| 7,721,182 | B2 * | 5/2010 | Joseph et al. | 714/766 |
| 7,783,957 | B2 * | 8/2010 | Carnevale et al. | 714/766 |
| 8,156,404 | B1 * | 4/2012 | Glasco et al. | 714/766 |
| 8,225,172 | B2 * | 7/2012 | Kasa | 714/758 |

(Continued)

OTHER PUBLICATIONS

Hamming, "Error Detecting and Error Correcting Codes", *The Bell System Technical Journal*, vol. XXIX, No. 2, Apr. 1950, 14 pgs.

(Continued)

*Primary Examiner* — John J Tabone, Jr.
(74) *Attorney, Agent, or Firm* — Nixon & Vanderhye P.C.

(57) ABSTRACT

A data processing apparatus is provided having error code generation circuitry configured to generate an error code associated with a received data value, such that a bit change in the received data value can be known about by reference to the error code. Stored data values are stored in a data store and associated error codes are stored in an error code store. Error checking circuitry performs a verification operation on a stored data value and an associated error code to determine if an error has occurred in at least one of the stored data value and the associated error code during storage. The received data value comprises at least one additional bit with respect to the stored data value and the error checking circuitry is configured to reconstruct the at least one additional bit by reference to the stored data value and the associated error code.

21 Claims, 14 Drawing Sheets

(56) References Cited

U.S. PATENT DOCUMENTS

| | | | | |
|---|---|---|---|---|
| 8,245,110 | B2 * | 8/2012 | Miura | 714/766 |
| 8,271,856 | B2 * | 9/2012 | Kang et al. | 714/764 |
| 8,347,183 | B2 * | 1/2013 | Yoon et al. | 714/766 |
| 8,464,093 | B1 * | 6/2013 | Swenson et al. | 714/5.1 |
| 8,473,815 | B2 * | 6/2013 | Chung et al. | 714/766 |
| 8,499,221 | B2 * | 7/2013 | Franceschini et al. | 714/767 |
| 8,533,558 | B2 * | 9/2013 | Yurzola et al. | 714/758 |
| 8,539,313 | B2 * | 9/2013 | D'Abreu et al. | 714/766 |
| 2003/0041299 | A1 * | 2/2003 | Kanazawa et al. | 714/766 |
| 2006/0036833 | A1 | 2/2006 | Piry et al. | |
| 2006/0156196 | A1 * | 7/2006 | Takahashi et al. | 714/766 |
| 2009/0089646 | A1 * | 4/2009 | Hirose et al. | 714/766 |
| 2010/0306635 | A1 * | 12/2010 | Tang et al. | 714/807 |
| 2012/0166910 | A1 * | 6/2012 | Baek et al. | 714/758 |
| 2012/0192035 | A1 * | 7/2012 | Nakanishi | 714/766 |
| 2013/0073921 | A1 * | 3/2013 | Kamoshida | 714/758 |
| 2013/0275832 | A1 * | 10/2013 | D'Abreu et al. | 714/764 |

OTHER PUBLICATIONS

Ziegler et al., "Accelerated Testing for Cosmic Soft-Error Rate", *IBM J. Res. Develop.*, vol. 40, No. 1, Jan. 1996, pp. 51-72.

Hsiao, "A Class of Optimal Minimum Odd-weight-col. SEC-DED Codes", *SEC-DED Code*, Jul. 1970, pp. 395-401.

Fault Detection and ECC for State Bits, "Error Coding Techniques", No. Date, pp. 161-178.

* cited by examiner

| | Number of Actual Errors | | | | |
|---|---|---|---|---|---|
| | 0 | 1 | 2 | 3 | |
| SEC-DED Decision | No error | Detect 1 & Correct | Detect 2 & Unrecoverable | Detect 3 & Unrecoverable | Detect 1 & Correct |
| Correct Decision | YES | YES | YES | YES | NO (miss-correction) |

FIG. 3A (Prior Art)

| Missing bit value is X | Number of Actual Errors | | | |
|---|---|---|---|---|
| | 0 | 1 | 2 | |
| Syndrome from checker that assumes missing Bit is X | No error | Detect 1 & Correct | Detect 2 & Unrecoverable | Detect 2 & Unrecoverable |
| Syndrome from checker that assumes missing Bit is X' | Detect 1 & Correct | Detect 2 & Unrecoverable | Detect 3 & Unrecoverable | Detect 1 & Correct |
| Decoder Decision | No error & Infer Missing Bit | Detect 1 & Correct & Infer Missing Bit | Detect 2 & Unrecoverable | Detect 1 & Correct & Infer Missing Bit |
| Correct Decision | YES | YES | YES | NO (miscorrection) |

FIG. 3B

| | Number of Actual Errors | | | |
|---|---|---|---|---|
| | 0 | 1 | 2 | |
| Baseline EDC | No error | Detect 1 & Correct | Detect 2 & Unrecoverable | |
| Proposed Scheme | No error | Detect 1 & Correct | Detect 3 & Unrecoverable | Detect 1 & Correct (miss-correction) |

FIG. 3C

| SYNDROME# | 63... | ...41... | BIT POSITION | ...20... | ...Ø | CHECK VALUES |
|---|---|---|---|---|---|---|
| 0 | | 1 | | 0 | | $CHECK_0$ |
| 1 | | 0 | | 0 | | $CHECK_1$ |
| 2 | | 1 | | 0 | | $CHECK_2$ |
| 3 | | 1 | | 0 | | $CHECK_3$ |
| 4 | 10... | 1 | | ...1... | ...10 | $CHECK_4$ |
| 5 | | 0 | | 0 | | $CHECK_5$ |
| 6 | | 1 | | 1 | | $CHECK_6$ |
| 7 | | 1 | | 1 | | $CHECK_7$ |

PARITY CHECK MATRIX

FIG. 4 (Prior Art)

POLARIZATION BIT

32-BIT DATA VALUE

| Bit | Pol | 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 | |
|---|---|---|---|---|---|---|---|---|---|---|---|---|---|---|---|---|---|---|---|---|---|---|---|---|---|---|---|---|---|---|---|---|---|---|
| Parity 2 | X | | | | X | | | | X | | | | X | | | | X | | | | X | | | | X | | | | X | | | | X | $DATA_A$ |
| Parity 1 | X | X | | X | | X | | X | | X | | X | | X | | X | | X | | X | | X | | X | | X | | X | | X | | X | | $DATA_B$ |
| Parity 0 | X | | X | | | | X | | | | X | | | | X | | | | X | | | | X | | | | X | | | | X | | | $DATA_C$ |

FIG. 13

DATA PROCESSING APPARATUS USING IMPLICIT DATA STORAGE DATA STORAGE AND METHOD OF IMPLICIT DATA STORAGE

BACKGROUND OF THE INVENTION

1. Field of the Invention

The present invention relates to a data processing apparatus having error code generation circuitry configured to generate an error code associated with a data value. More particularly, this invention relates to such a data processing apparatus wherein the error code is constructed such that a bit change in the data value can be known about by reference to the error code.

2. Description of the Prior Art

In a data processing apparatus which stores data values, it is known to provide error code generation circuitry which generates an error code associated with a data value, the error code being constructed such that a bit change in a data value can be known about by reference to the error code. This error code may be configured as a error detection mechanism, for example where the error code is a parity value generated from the bits of the data value, which enables a bit change in the data value to be detected, although not corrected. Alternatively it is also known to provide more extensive error codes which allow not only the detection of an error in the data value but the correction of that error as well (as long as the error is not too extensive). Many of these error detection and correction techniques refer back to the seminal paper "Error detecting and correcting codes", R. W. Hamming, Bell Systems Technical Journal, 29 (2): 147-163, 1950. An overview of the relevant error coding techniques can be found in "Architecture Design for Soft Errors", Elsevier Inc, 2008 by S Mukherjee in Chapter 5, pages 161-178.

As one example, it is known to provide error detection and correction (EDC) codes which are generated according to a "single error correction double error detection" (SEC-DED) code, for example a (72, 64) SEC-DED code for protecting a 64 bit data value. Such SEC-DED codes are known for example from "A class of optical minimum odd-weight-column SEC-DED codes", M. Y. Hsiao, IBM Journal of Research and Development, v.14 n.4, pages 395-401, July 1970. The SEC-DED codes are based on parity matrices which define a number of syndromes which are to be calculated from a data value wherein each syndrome comprises a parity calculation using a different subset of bits from the data value, together with a bit taken from an error code previously generated in association with the data value (and itself generated in accordance with the same subset of bits of the data value), such that a bit pattern generated from the defined syndromes allows a determination of whether no error is present in the data value (with respect to the value its had when the error code was generated), whether a single bit value has changed (and the bit location of that change, thus enabling the bit change to be corrected), or whether a double bit error has occurred, but not enabling this double bit error to be corrected. More complex error correction codes are also known, which for example allow double error correction and triple error detection, at the cost of an increased number of error code bits.

The protection of data stored in a data processing apparatus against bit changes that may occur is clearly a desirable technique. Such bit changes may for example result from particle strikes as described in "Accelerated testing for cosmic soft-error rate", J. F. Ziegler, et al., IBM J. Res. Dev. 40, 1 (January 1996), 51-72, 1996.

The above mentioned error detection and correction techniques have established themselves as useful and reliable mechanisms for protecting data stored in a data processing apparatus against bit changes which may result from natural causes such as particle strikes, or may alternatively result from an invasive attack by an attacker seeking to disrupt the operation of the data processing apparatus or to derive information about the data processing activities which it is carrying out or the data values stored within it.

SUMMARY OF THE INVENTION

Viewed from a first aspect, the present invention provides a data processing apparatus comprising:

error code generation circuitry configured to generate an error code associated with a received data value, said error code being constructed such that a bit change in said received data value can be known about by reference to said error code;

a data store in which stored data values are stored;

an error code store in which associated error codes corresponding to said stored data values are stored; and error checking circuitry configured to perform a verification operation on a stored data value and an associated error code to determine if an error has occurred in at least one of said stored data value and said associated error code during storage, wherein said received data value comprises at least one additional bit with respect to said stored data value and wherein said error checking circuitry is configured to reconstruct said at least one additional bit by reference to said stored data value and said associated error code.

The inventors of the present invention realised that an error code generated in association with a received data value wherein the error code is constructed such that a bit change in the data value can be known about by reference to the error code, could be exploited to enable at least one bit of the data value to be omitted when the data value is stored, and yet to be reconstructed with reference to the stored data value and the error code at a later stage. Hence, error checking circuitry is provided which, in the conventional matter, performs a verification operation on a stored data value and its associated error code to determine if an error has occurred in either the stored data value or its associated error code during storage, but is further configured to reconstruct at least one additional bit which formed part of a received data value but was not comprised within the stored data value by reference to the stored value and the associated error code. In other words, the at least one additional bit present in the received data value need not be explicitly stored with the stored data value but rather is implicitly stored in the error code. This has a number of advantages. Firstly the size of the stored data value is reduced by the at least one additional bit, thus saving valuable storage space and the physical size of a storage structure may be reduced without reducing its logical capacity. This may of course be viewed in the inverse fashion wherein for a given physical size of storage structure its logical capacity is increased by the at least one implicitly stored additional bit. Another advantage relates to the protection of data values stored with a data processing apparatus (for example in the context of a security-related device which handles data which it is desired to keep hidden from external view) in which case the implicit storage of the at least one of the additional bit is advantageous because the at least one additional bit is not explicitly stored within the data processing apparatus, where such explicit storage could (at least in principle) mean that it is potentially visible.

The error code may take a number of forms, but in one embodiment said error code comprises an error detection and correction code, wherein said error detection and correction code is constructed such that said bit change in said received data value can be corrected by reference to said error correction code. Thus, the error code may comprise sufficient redundancy that the error checking circuitry is not merely able to identify that a bit change in the received data value has happened but is further able to make use of the redundancy in the error correction code to enable the bit change to be corrected.

The error correction code could take a variety of forms but in one embodiment said error correction code is a single error correction double error detection (SEC-DED) code. A SEC-DED code is beneficial because double errors are relatively infrequent (and indeed triple or greater errors are very infrequent) and accordingly the expense of storing additional bits in association with a data value in the form of an error code is worthwhile because of the ability of the code to correct (relatively common) single errors. More complex error correction codes able to correct double (or greater) errors (DEC-TED etc.) are also conceivable, although these come at the cost of the greater storage requirement for the associated error code.

In one embodiment said error checking circuitry is configured to perform said verification operation using said error correction code and alternative values for said at least one additional bit in order to reconstruct where possible said at least one additional bit. The at least one additional bit is initially unknown to the error checking-circuitry (since it has not been explicitly stored) and accordingly performing the verification operation using alternative values for the at least one additional bit enables the error checking circuitry to determine the correspondence between the associated error code and the implicitly stored at least one additional bit having each of those alternate values. This in turn enables the error checking circuitry to determine which of those alternative values is correct (assuming that the number of bit changes which has occurred does not prevent this from happening).

It will be recognised that the verification operation could take a number of forms, depending on the nature of the error code generated, its complexity and so on. However, in one embodiment said verification operation is performed with reference to a parity check matrix, said parity check matrix defining a plurality of syndromes, each syndrome of said plurality of syndromes defining a parity value determined for a selected subset of bits of said received data value and a selected bit of said error code, wherein said selected bit of said error code is a parity value of said selected subset of bits of said received data value, and wherein said parity check matrix is defined such that parity values determined for said plurality of syndromes enable identification of a bit position where said bit change occurred.

A parity check matrix defining a plurality of syndromes is a particularly useful mechanism for generating associated error codes and performing the subsequent verification operation, since the subset of bits of the data value may be chosen such that when a bit change occurs an examination of the syndromes which have been affected by this bit change enables the bit position of that bit change to be determined. More particularly, in the context of the present invention, a parity check matrix and its associated plurality of syndromes enables a comparison to be made between the set of syndrome values generated with a first assumed value for each one additional bit and the set of syndrome values with the alternative value for each one additional bit. A comparison between these sets of syndrome values then enables a determination to be made of whether errors have occurred in the data value and the at least one additional bit to be inferred (so long as the number of errors is not too high).

In one embodiment, said error checking circuitry is configured to perform said verification operation assuming a predetermined value of said at least one additional bit and said error checking circuitry further comprises at least one inverter configured to additionally generate an inverted parity value for each syndrome for which said selected subset of bits comprises said at least one additional bit.

Accordingly, the error checking circuitry may be configured to assume that the at least one additional bit has a predetermined value. For example, the error checking circuitry could perform its syndrome calculations on the assumption that the at least one additional bit is a "0" (this choice is arbitrary and could just as well be "1"). In order to determine the effect of the additional bit in fact having the opposite value, the error checking circuitry further comprises an invertor which generates an inverted parity value for each syndrome which comprises the at least one additional bit. Hence, for example, where three syndromes include the bit position of the at least one additional bit, an inverter is provided for each of those three syndromes to additionally generate an inverted parity value for those three syndromes. In this manner, the error checking circuitry then has all the information required to compare a set of syndrome values which should be generated for each permutation of the (implicitly stored) at least one additional bit. On this basis, the error checking circuitry can then detect whether errors have occurred and, where possible, infer the value of the at least one additional bit.

In one embodiment, said at least one additional bit in said received data value is at a chosen bit position which contributes to a minimum number of syndromes in said plurality of syndromes.

It is advantageous to select a bit position (or bit positions) for the at least one additional bit in the received data value which contributes to a minimal number of syndromes in the plurality of syndromes associated with the parity check matrix. Depending on the particular layout of the parity check matrix, different bit positions may contribute to a varying number of the syndromes to be calculated. It is advantageous therefore to choose a bit position which contributes to a minimum number of syndromes, such that a number of invertors which needs to be provided is also minimised. For example, in one embodiment which uses a 72-64 SEC-DED code, the minimum number of syndromes to which any bit position in the 64 bit data value contributes is 3 (and indeed there are several bit positions for which this is true) and in this embodiment there is 1 bit of the 64 bit data value which is implicitly stored. The bit to be implicitly stored is then chosen to correspond to one of these bit positions and therefore only 3 invertors need to be provided.

In one embodiment said error checking circuitry is configured to determine an outcome, on the basis of said verification operation, said outcome selected from the group comprising:

a) no bit change has occurred and said at least one additional bit can be reconstructed;

b) said bit change has occurred, said bit change is correctable and said at least one additional bit can be reconstructed; and c) said bit change has occurred, said bit change is not correctable and said at least one additional bit cannot be reconstructed.

In one embodiment said error checking circuitry is configured to perform multiple verification operations, each verification operation corresponding to each alternative value of said at least one additional bit.

Accordingly, in such embodiments instead of performing a single verification operation which takes into account the alternative values of each additional bit, the error checking circuitry may perform multiple verification operations each corresponding to an alternative value of the at least one additional bit. This has the advantageous that the error checking circuitry is relatively simpler than error checking circuitry which performs the verification operation in a single step, but comes at the cost of having to perform the multiple verification operations.

In one embodiment said error checking circuitry is configured to perform said multiple verification operations sequentially. Accordingly, only a single relatively simple error checking circuitry need be provided, which then performs as many verification operations as there are alternative values of the at least one additional bit.

Alternatively, in another embodiment, said error checking circuitry is configured to perform said multiple verification operations in parallel using replicated checking circuitry. Hence, a faster output of the error checking circuitry may be provided by means of this parallel approach, although at the expense of replicating at least part of the error checking circuitry.

In one embodiment said error code comprises at least one parity bit, said at least one parity bit indicative of a parity value of at least part of said received data value, wherein said at least part of said received data value includes said at least one additional bit. In other embodiments said error code comprises a plurality of parity bits, wherein each parity bit of said plurality of parity bits is indicative of an individual parity value of an individual subset of bits within said received data value, wherein each said individual subset of bits includes said at least one additional bit.

The use of at least one parity bit in the error code can provide an advantageously efficient mechanism of detecting that a bit change in the data value has occurred. There may for example be only one parity bit which indicates that a bit change has occurred somewhere in the data value. Alternatively more than one parity bit may be provided wherein each parity bit protects a different subset of the data value, such that protection against more than one consecutive bit change can be provided. Whatever the number of parity bits, according to the present techniques the at least one additional bit is included in the subset of the data value protected by the given parity value, such that the at least one additional bit can be implicitly stored by use of the at least one parity bit.

In one embodiment, said at least one additional bit comprises a polarity bit, said polarity bit indicative of a plurality of data bits forming at least part of said received data value, wherein values of said data bits when said polarity bit has a first value are complementary to values of said data bits when said polarity bit has a second value. Accordingly, a polarity bit may be provided which provides a variety of "encryption" for the data value, wherein the data value is inverted when the polarity bit is inverted. This may for example be a useful technique in the context of security-related data processing apparatuses where it is desirable to vary the performance and power signature of the data processing apparatus even when the same data value is being handled. Using a polarity bit (for example a randomly generated polarity bit) provides one mechanism for doing this. Further, in the context of the present invention, the polarity bit then represents a significant, security-related item of data within the data processing apparatus and it is advantageous if it can be implicitly stored rather than being explicitly stored within the data processing apparatus, since this improves the resistance of the data processing apparatus to attack.

In one embodiment said at least one additional bit comprises a data value bit, wherein said received data value comprises a plurality of data value bits which together form a unitary data value which is subject to data processing in said data processing apparatus, and wherein said data value bit is comprised within said plurality of data value bits. Hence, the additional bit which is implicitly stored may be a bit taken from a data value itself (as opposed to an additional item stored in association with a data value such a metadata value).

Alternatively, in one embodiment said at least one additional bit comprises a metadata bit, wherein said received data value comprises a plurality of data value bits which together form a unitary data value which is subject to data processing in said data processing apparatus, and wherein said metadata bit configures at least one aspect of said data processing. Hence, in this embodiment the at least one additional bit which is implicitly stored may represent "additional" data which is stored in association with a data value. This metadata could take a number of forms but might, in the example of data value stored in a cache, be metadata such as a security bit, a most recently used flag, a taint marker and so on. The invention is clearly not limited to these specific examples and many different metadata bits that could be implicitly stored will be familiar to the skilled person.

The data store could take a variety of forms, but in some particular embodiments said data store is selected from the group comprising a register file, a cache, a memory, a translation lookaside buffer and a branch target buffer. The present techniques are not specifically linked to any type of data store.

The error code store may be a separate storage device to the data store, but in some embodiments said error code store forms part of said data store.

In one embodiment the data processing apparatus further comprises control circuitry configured to switch said data processing apparatus into a non-implicit-storage mode in which said received data value comprises no additional bits with respect to said stored data value and which said error checking circuitry is configured not to seek to reconstruct said at least one additional bit by reference to said stored data value and said associated error code. Accordingly the control circuitry can optionally switch off the "implicit storage" behaviour. This may for example be advantageous if there are circumstances in which the at least one additional bit is used in the further processing of the data processing apparatus and circumstances in which the at least one additional bit is used in the further processing of the data processing apparatus. Thus a fixed size of storage for the data value and the error code can be provided, but the data processing apparatus can optionally increase the logical size of the storage by the at least one bit when required.

Viewed from a second aspect, the present invention provides a data processing apparatus comprising:

error code generation means for generating an error code associated with a received data value, said error code being constructed such that a bit change in said received data value can be known about by reference to said error code;

data store means for storing stored data values;

error code store means for storing associated error codes corresponding to said stored data values; and error checking means for performing a verification operation on a stored data value and an associated error code to determine if an error has occurred in at least one of said stored data value and said associated error code during storage, wherein said received data value comprises at least one additional bit with respect to said stored data value and wherein said error checking means for reconstructing said at least one additional bit by reference to said stored data value and said associated error code.

Viewed from a third aspect, the present invention provides a method of processing data comprising the steps of:

generating an error code associated with a received data value, said error code being constructed such that a bit change in said received data value can be known about by reference to said error code;

storing stored data values a data store;

storing in an error code store associated error codes corresponding to said stored data values;

performing a verification operation on a stored data value and an associated error code to determine if an error has occurred in at least one of said stored data value and said associated error code during storage, wherein said received data value comprises at least one additional bit with respect to said stored data value; and reconstructing said at least one additional bit by reference to said stored data value and said associated error code.

BRIEF DESCRIPTION OF THE DRAWINGS

The present invention will be described further, by way of example only, with reference to embodiments thereof as illustrated in the accompanying drawings, in which:

FIG. 3A presents a table showing the possible responses of a SEC-DED code based system to a varying number of errors in the prior art;

FIG. 3B presents a table showing the response of a data processing apparatus using a SEC-DEC code in one embodiment to a varying number of errors;

FIG. 3C presents a table comparing a prior art error detection and correction scheme to a proposed scheme according to one embodiment;

FIG. 4 schematically illustrates a parity check matrix for a (72,64) SEC-DED code;

FIG. 13 presents an example distribution of data bits in a 32 bit example where 3 parity bits are generated for polarised data such as that stored in the example of FIG. 12.

DESCRIPTION OF THE PREFERRED EMBODIMENTS

Figure 1:
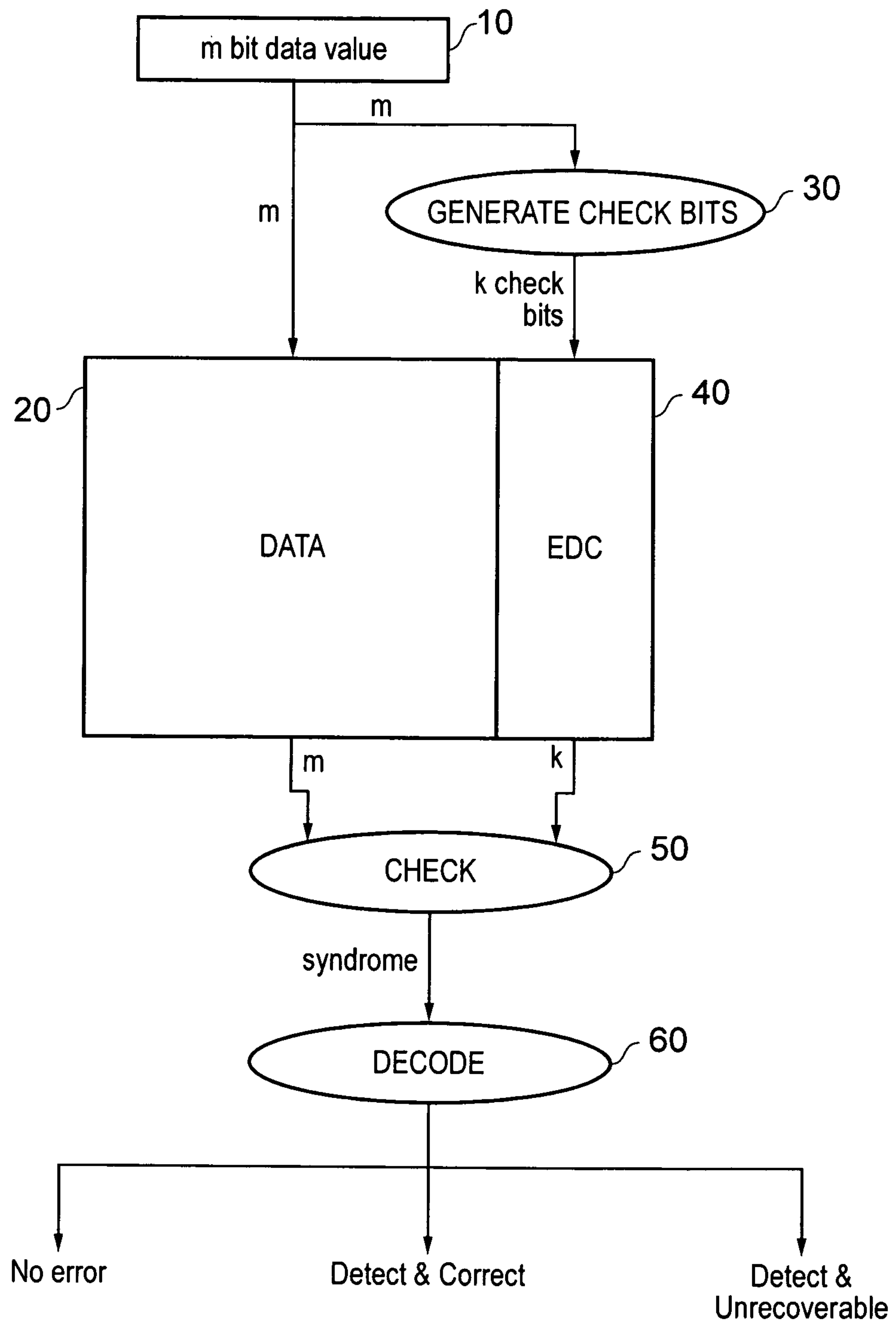
FIG. 1 schematically illustrates a prior art data processing apparatus in which error detection codes are generated and stored in association with data values to enable errors occurring during storage to be detected and corrected.

FIG. 1 schematically illustrates a prior art data processing apparatus. An m bit data value 10 is received and the m data bits are stored in an entry of the data store 20, whilst those m bits of data are also used by check bit generation circuitry 30 to generate k check bits which are stored in an error code store 40 associated with the data store 20. For example, data store 20 and error code store 40 could be embodied as a cache where an m bit data value stored in the cache is stored with k check bits associated with it in order to protect against data errors. When the data value is required, the m bit data value and k bit check value are read out and error checking circuitry 50 determines a "syndrome" on the basis of those m+k bits. For example, this syndrome may be defined by a single error correction double error detection (SEC-DED) code: defining a number of syndrome bits which should be calculated from the m+k bits. FIG. 4 (discussed in more detail below) shows an example parity check matrix which defines an 8 bit syndrome value for a (72, 64) SEC-DED code. Then decoding circuitry 60 interprets the bit values of the syndrome determined by error checking circuitry 50 and determines the outcome. The possible outcome are that it is determined that no error has arisen in the stored data value (or its associated error code), that a correctable error has occurred, or that the extent of the error which has occurred is such that the error is unrecoverable.

Figure 2:
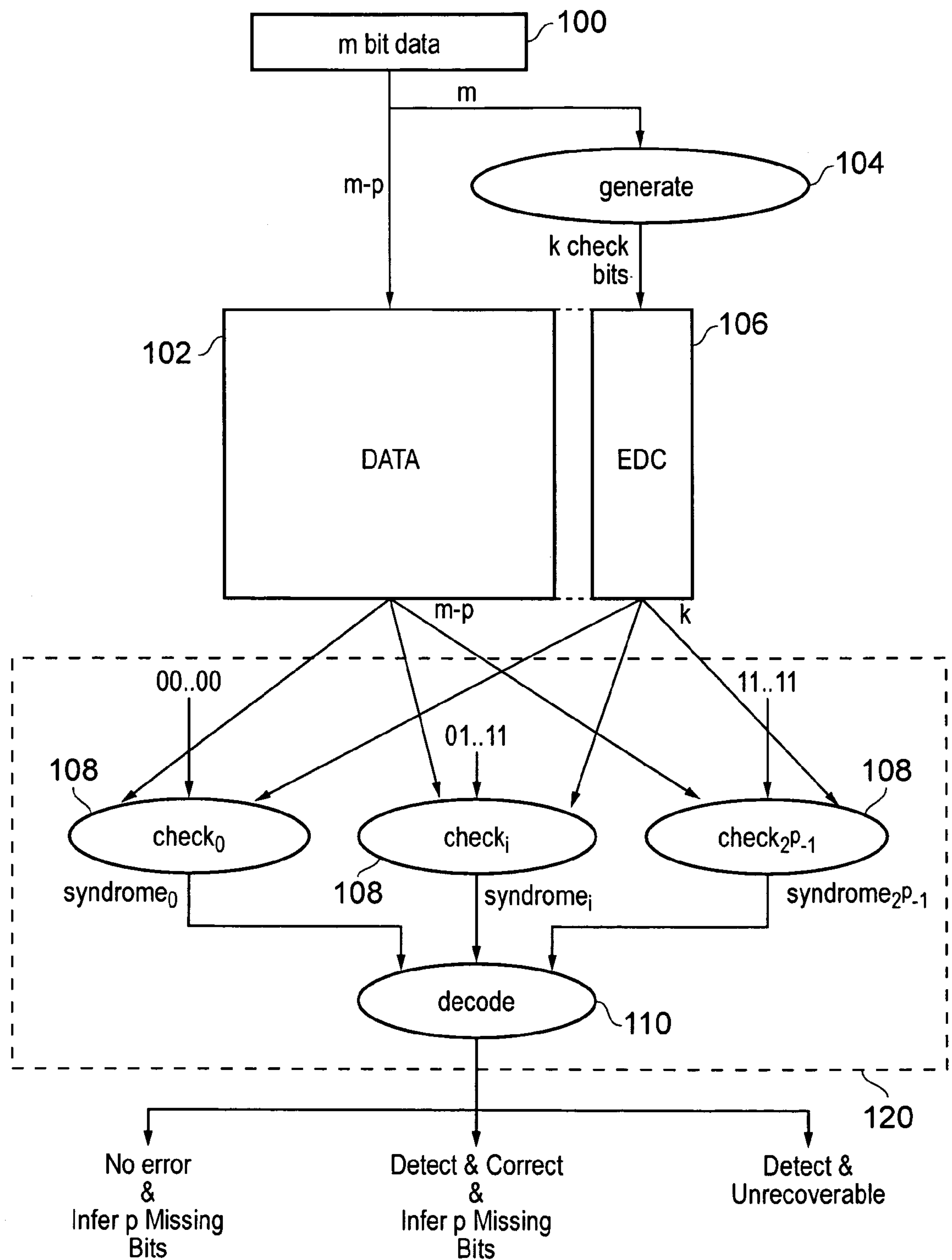
FIG. 2 schematically illustrates a data processing apparatus in one embodiment in which p bits of an m bit data value are implicitly stored and reconstructed by the error checking circuitry.

The present invention is based on the realisation that the generation of the check bits on the basis of the received data value can enable at least one bit of the m bit data value not to be explicitly stored, but to be inferred later from a comparison of the stored data value (in which this at least one data bit was omitted) and the stored error code. Accordingly, as illustrated in FIG. 2, the same m bit data value 100 is initially received, but p bits of this data value are omitted when the data value is stored in data store 102. Meanwhile, the full set of m data bits are used by the error code generation circuitry 104 to generate the k check bits which are stored in association with the stored data value in the error code store 106. Note that data store 102 and error code store 106 may be separate storage structures as illustrated, but may alternatively be a unified storage structure. There are various types of data store which could be represented by data store 102 such as a register file, a cache, a memory, a translation lookaside buffer, a branch target buffer and so on.

When the original data value is required again, the m-p data bits are read out from the data store 102 and the associated k check (error) bits are read out from the error code store 106. Error checking circuitry 120 then uses these m-p and k bits to perform a number of check functions 108, wherein each check function generates a corresponding syndrome value. The number of syndrome values which are determined by the error checking circuitry depends on the number of the omitted data bits p such that overall $2^p$ syndrome values must be generated for p omitted bits. Each check 108 performed by the error checking circuitry 120 is determined with reference to an assumed value for the omitted bits p. In FIG. 2 this is illustrated by the predetermined values "00.00", "01.11" and "11.11" being fed into each of the check stages 108 respectively (note that only three check stages 108 are illustrated for brevity). The $2^p$ syndrome values thus, determined are decoded by decoding circuitry 110 in order to determine an outcome. In principal the possible outcomes can be categorised to three classes as shown in FIG. 2. Firstly, it may be determined that no errors are present in the data values retrieved from data store 102 and 106 and that the p missing bits can be inferred. Secondly it may be determined that a limited number of errors have occurred which can be corrected and that the p missing bits can be inferred. Thirdly, it may be determined that the number of errors which has occurred are too numerous to allow correction and inferral of the missing bits.

Viewed another way, the error checking circuitry 120 attempts to infer the missing p data bits by decoding $2^p$ times, each time with a different value for the missing p bits. The decoder considers the $2^p$ syndromes thus produced to seek to determine what the missing p bit value is, whether an error is detected and if it can be corrected. It will therefore be understood that the number of bits p which can be implicitly stored and successfully inferred will depend on the error detection and correction (EDC) code being used. For example, for SEC-DED based codes the maximum number of bits p which can be implicitly stored and inferred is three, one less than the minimum Hamming distance of the code. Generally, for SEC-DED based codes, an n bit code word is required to protect m bits of data where n>m, the number of check bits k=n−m and $m<2^{k-1}-k$.

FIG. 3A shows the possible outcomes in dependence on the number of actual errors in a stored data value when using a typical prior art SEC-DED based code (i.e. without implicit bit storage as proposed by the present techniques). When zero, one or two errors occur, the number of errors are covered by the strength of the SEC-DED code and a corrected decision can be expected. Specifically, if there are no errors this can be correctly identified and if there is one error this can be correctly identified and corrected for. If there are two errors this fact can be identified and be recognised to be unrecoverable. However, when three errors occur ideally this fact will be recognised by the system (and noted as unrecoverable), but in other cases these three error may be incorrectly treated as a single bit error that leads to a miscorrection (i.e. an attempt to correct what is wrongly interrupted as only a single error).

FIG. 3B sets out the decisions made by a system using the present techniques with respect to the number of actual errors. In this example implementation, one data bit is implicitly stored (i.e. p=1). The essential difference with respect to the decision making process of the prior art set out in FIG. 3A is that according to the present techniques (in the example where one bit is implicitly stored) two calculations of the syndrome values are performed, one for each possible value for the implicitly stored (i.e. missing) bit.

Hence, it can be seen from FIG. 3B that the syndrome calculated by the checker for each assumed value of the implicitly stored bit gives a corresponding interpretation for each number of actual errors. As shown in FIG. 3B, the implicitly stored (missing) bit value in this example is X and accordingly, the responses listed for the syndrome assuming that the missing bit is X correspond to the SEC-DED decisions listed in FIG. 3A. Conversely, the responses listed for the syndrome assuming that the missing bit is X' (i.e. making the wrong assumption about the value of the missing bit) correspond to one more actual error than is in fact the case. This is due to the fact that the assumption about the value of the missing bit is incorrect and the syndrome interrupts this "wrong" value for the missing bit as an actual error in the data. Particularly problematic is the response for the syndrome assuming that the missing bit is X' in the event of two actual errors, since this situation may be interpreted as "detect 1 and correct", which leads to the wrong overall decision as explained in more detail below.

The combination of the two sets of responses resulting from syndrome values determined for the two alternative values of the missing bit allow the decoder to provide an overall decision relating to the number of actual errors and the missing bit value. When there are no errors, the decoder can identify this fact from the "no error" outcome from the syndrome which assumed the correct value for the missing bit and on this basis the value of this missing bit is also determined. When there is a single error, the decoder can detect and correct the error using the syndrome result which indicates one detected error whilst the other indicates two errors (namely the actual error and one due to the wrongly assumed value of the missing bit). In the event of two actual errors there is a chance for miscorrection. This is due to the fact that there are two possible outcomes for the syndrome produced by the checker that assumes the wrong value (X') for the missing bit, namely the detection of three errors (which is known to be an "unrecoverable" situation or the (incorrect) determination that only one actual error has occurred (which in principle is a correctable situation). In this latter situation the decoder responds in the same manner as when there is only one actual error, namely by concluding that one error has occurred, correcting it and inferring the missing bit, but in this case the wrong assumption about the missing bit occurs. The inventors of the present invention have determined that for a 72-64 SEC-DED code based implementation (such as that discussed in "A class of optical minimum odd-weight-column SEC-DED codes", M. Y. Hsiao, IBM Journal of Research and Development, v.14 n.4, pages 395-401, July 1970), and based on an analysis which assumes uniformly distributed 64 bit values, it has been found that the probability of getting a miscorrection is about 30% in the case of two actual data errors. Conversely, this means that 70% of double error cases can be correctly detected by the present techniques.

FIG. 3C provides a comparison of the outputs of a syndrome decoder for a typical prior art SEC-DED based system ("Baseline EDC") and the single implicit bit embodiment of the present technique discussed above with reference to FIG. 3B ("Proposed Scheme") as a function of the number of actual errors that might occur. It can be seem that the behaviour is the same for zero and one errors, but in the case of two errors the proposed scheme (for the reasons discussed above) can lead to a miscorrection. However, as also noted above, this has been found in a typical scenario to only occur in about 30% of the two error cases, and further this must be seen in the context of the fact that two errors are comparatively rare.

FIG. 4 schematically illustrates the structure of a parity check matrix which defines the syndrome values which may be calculated for a 64-bit data value. This could for example be a parity check matrix for a 72-64 SEC-DED code such as that defined in a "A class of optical minimum odd-weight-column SEC-DED codes", M. Y. Hsiao, IBM Journal of Research and Development, v.14 n.4, pages 395-401, July 1970), the entire contents of which are incorporated herein by reference. The parity check matrix illustrated in FIG. 4 shows the principle of the parity check matrix, check values and defined syndromes. The parity check matrix defines for each syndrome a subset of the bits of the 64-bit data value which are to be used for the determination of that syndrome value. For example, as schematically illustrated in FIG. 4 syndrome #4 uses bit positions 63, 41, 20 and 1 (amongst others—not illustrated for brevity). The same subset of bits of the data value are used to determine the corresponding check value, wherein a given check value is determined as the XOR of the corresponding bit positions of the data value. A given syndrome value is then determined by taking the XOR of the relevant bits of the data value together with the corresponding check value. Accordingly, if the parity value determined from the data value is the same as the check value (which it should be if no errors have occurred) then this syndrome value will be zero. A syndrome value of one indicates a difference between the check value and the data value bits from which that check value was determined, indicating that an error has occurred. Accordingly, when an error occurs in the stored data value or its check value, one or more syndrome values will indicate this fact. Further, the parity check matrix is constructed such that the error bit position can be determined from the particular syndrome value(s) that is(are) triggered.

It can also been seen from FIG. 4 that a given bit position of the data value may only participate in a subset of the syndrome value calculations. For example, as illustrated, bit position 20 only contributes to the determination of syndrome values 4, 6 and 7. By contrast it can be seen that bit position 41 contributes to all syndrome values other than syndrome value 1 and value 5. In some embodiments of the present invention (discussed in more detail below with reference to FIG. 6) it is advantageous that the "implicit bit" which is not stored is selected to correspond to a bit position which contributes to a minimum number of syndromes in the set of syndromes defined by the parity check matrix. In the example parity check matrix illustrated in FIG. 4, all bit positions contribute to at least three syndrome values and accordingly bit position 20 represents a candidate for the implicit bit.

Figures 5A, 5B:
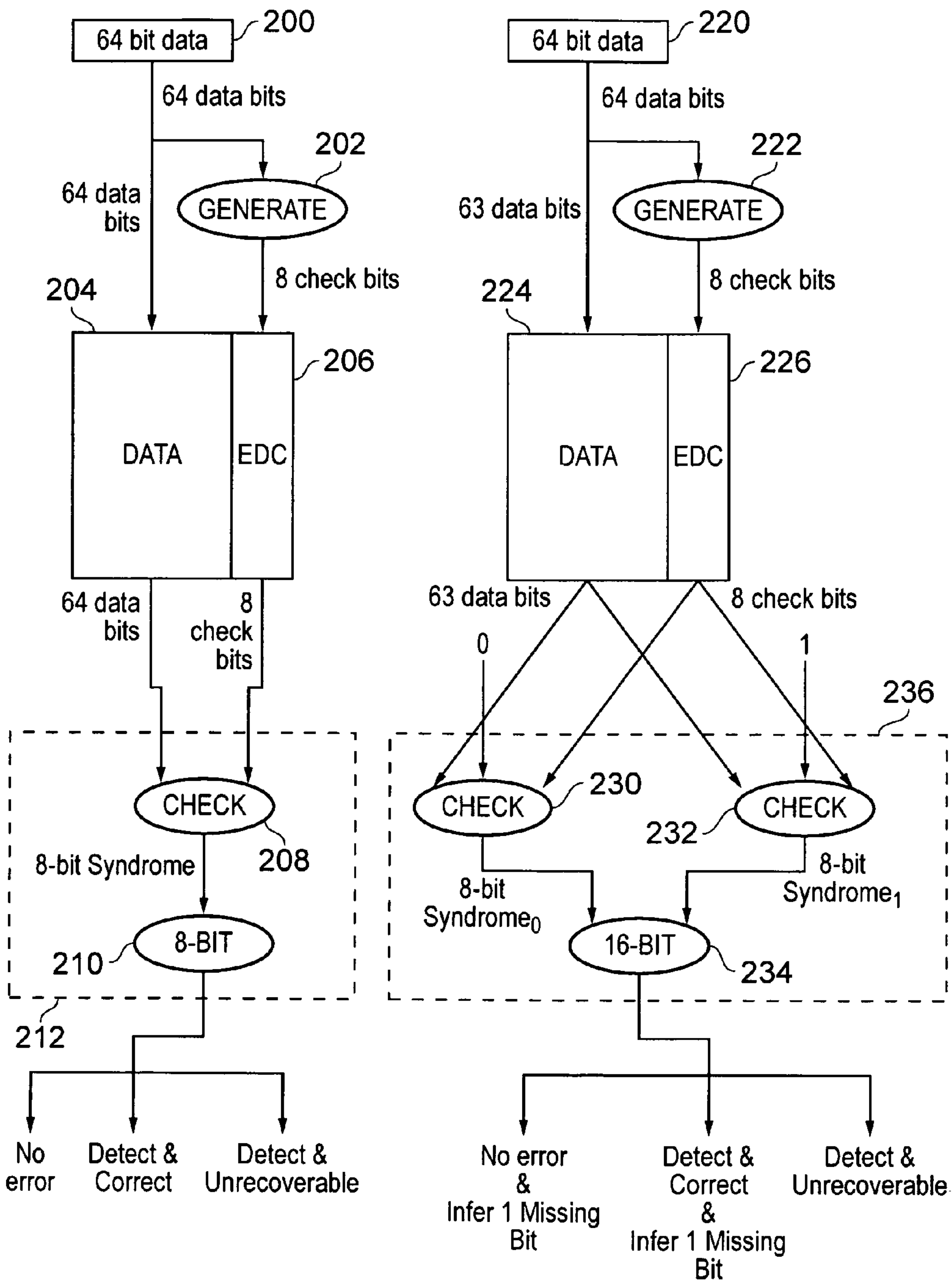
FIG. 5A schematically illustrates the operation of a prior art data processing apparatus employing a (72, 64) SEC-DED code.
FIG. 5B schematically illustrates the adaptation of the data processing apparatus of FIG. 5A according to one embodiment of the present techniques.

FIGS. 5A and 5B schematically illustrate the structural components and processes by which a 64 bit data value is stored, protected by EDC bits, read out and checked for errors between a prior art SEC-DED based system and a system according to one embodiment. FIG. 5A shows that a 64-bit data value 200 is received of which all 64 data bits are used by the check bit generation circuitry 202 to generate 8 check bits and all 64 data bits are stored in the data store 204. The generated 8 check bits are stored in the EDC storage 206. Later, when the data value is retrieved from the data store 204, the 64 data bits and the 8 check bits are passed into the error checking circuitry 212, in which an error checking function 208 is performed using the same parity check matrix which was used at 202 to generate the 8 check bits for storage. This results in an 8 bit syndrome value 210 which can be examined to determine whether no error has occurred in the 72 stored bits (64 data and 8 check), whether a correctable bit error has occurred or whether an unrecoverable bit error has occurred.

By comparison, the same 64 bit data value 220 is received by the system presented in FIG. 5B as one embodiment of the present invention. All 64 data bits are used by the check bit generation circuitry 222 in order to generate the 8 check bits which are stored in the EDC storage 226. As an aside, note that data store 224 and EDC store 226 are illustrated in FIG. 5B slightly physically separated. EDC store 226 could be provided as a separate storage unit to data store 224, or could instead be provided as part of a single integrated storage unit. Returning to the 64-bit data value 220, note that, significantly, only 63 data bits are passed to data store 224 for storage. One data bit is missing, being implicitly stored according to the present techniques within the 8 check bits stored in EDC store 226. Later, when the data value and its associated check bits are retrieved from the respective storage units, they are passed to the error checking circuitry 236 which performs a verification operation using both the 63 data bits retrieved from data store 224 and the 8 check bits retrieved from EDC store 226. Within the error checking circuitry 223 two check processes 230 and 232 are performed. In some embodiments these check processes may be performed sequentially by the same checking circuitry, whilst in other embodiments parallel error checking circuitry is provided such that these check processes may be performed simultaneously. The two check processes 230 and 232 are performed on the basis of a respective assumed value of the bit omitted from the data value 220 when it was stored in data store 224. Accordingly, as illustrated in FIG. 5B, the check 230 assumes a value of "0" for this bit, whilst the check 232 assumes a value of "1" for this bit. In this manner, two 8-bit syndrome values are generated which together form a 16-bit value 234. On the basis of this 16 bit value 234, the possible outcomes that the error checking circuitry 236 can determine are that no error has occurred and the missing bit value is inferred, that an error is detected, corrected and the missing bit is inferred or that errors are detected and determined to be unrecoverable (as discussed above with reference to FIGS. 3B and 3C).

Figure 6:
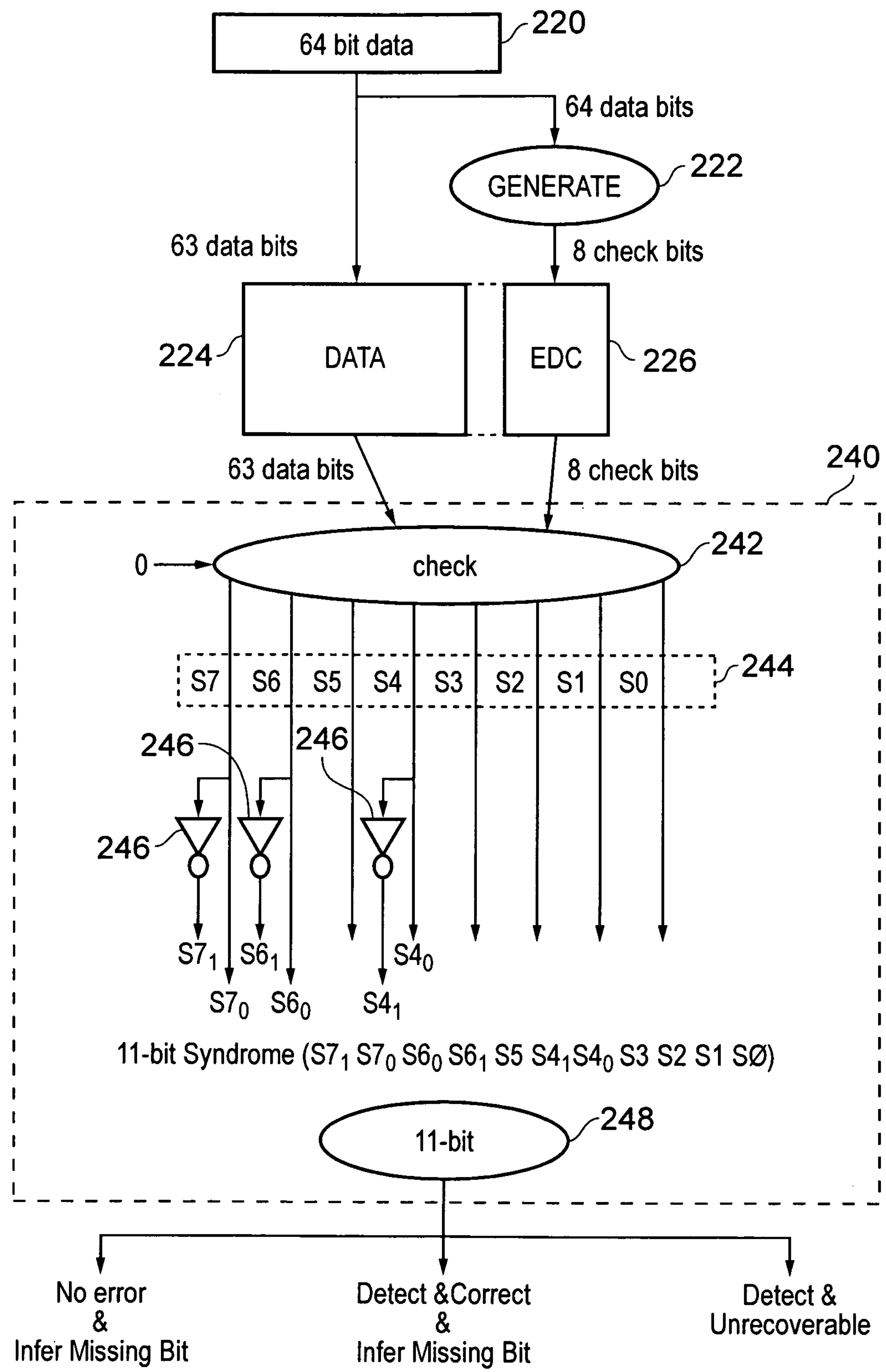
FIG. 6 schematically illustrates the configuration of a data processing apparatus in one embodiment in which a predetermined value for an implicitly stored data bit is used and invertors are provided to generate syndrome values corresponding to the alternative value for that data bit.

FIG. 6 schematically illustrates a variation on the embodiment schematically illustrated in FIG. 5B, in which the 16-bit syndrome value 234 generated by the error checking circuitry 236 is compressed to an 11-bit syndrome value. The first part of the Figure (seen from the top downwards) is the same as that schematically illustrated in FIG. 5B and items 220, 222, 224 and 226 are thus given the same reference numerals and the reader is referred to the description of FIG. 5 for the description thereof. When the data value and check bits are retrieved from the data store 224 and EDC store 226 they are passed to the error checking circuitry 240 which is configured to perform a single check process 242 to generate an 8 bit syndrome value 244. To do this, the check process 242 assumes a value of "0" for the implicitly stored data bit. The choice of "0" as the assumed value is arbitrary; "1" could equally well be used. In this embodiment, the implicitly stored data bit has been selected to correspond to a bit position in the parity check matrix used by the check process 242 which contributes to a minimum number of syndrome values within the overall syndrome value 244. In this case, check process 242 is performed on the basis of a parity check matrix such as that schematically represented in FIG. 4 and accordingly the minimum number of syndrome values to which any given bit position in the parity check matrix contributes is three. Further, in the embodiment schematically illustrated in FIG. 6, the implicitly stored data bit is omitted from bit position 20 of the 64 bit data value 220 and accordingly alternative values for this missing data bit will only have an effect on elements 4, 6 and 7 of the syndrome value 244 generated. In the light of this fact, the error checking circuitry 240 is further provided with three invertors 246 which produce an inverted value for the elements 4, 6 and 7 of the syndrome value 244. Accordingly, an 11-bit syndrome value 248 is generated which contains all the information which would be represented by full syndrome values produced for each alternative value of the missing data bit since elements 0-3 and 5 of the syndrome values are the same for each alternative value of the missing bit. Only bits 4, 6 and 7 change between the two, and the alternative values for these syndrome bits are provided in the 11 bit syndrome value 248.

Finally, on the basis of the 11 bit syndrome value 248, the error checking circuitry 240 can determine one of the possible outcomes listed at the foot of FIG. 6 which are the same as those listed at the foot of FIG. 5B and described with reference thereto.

Figure 7:
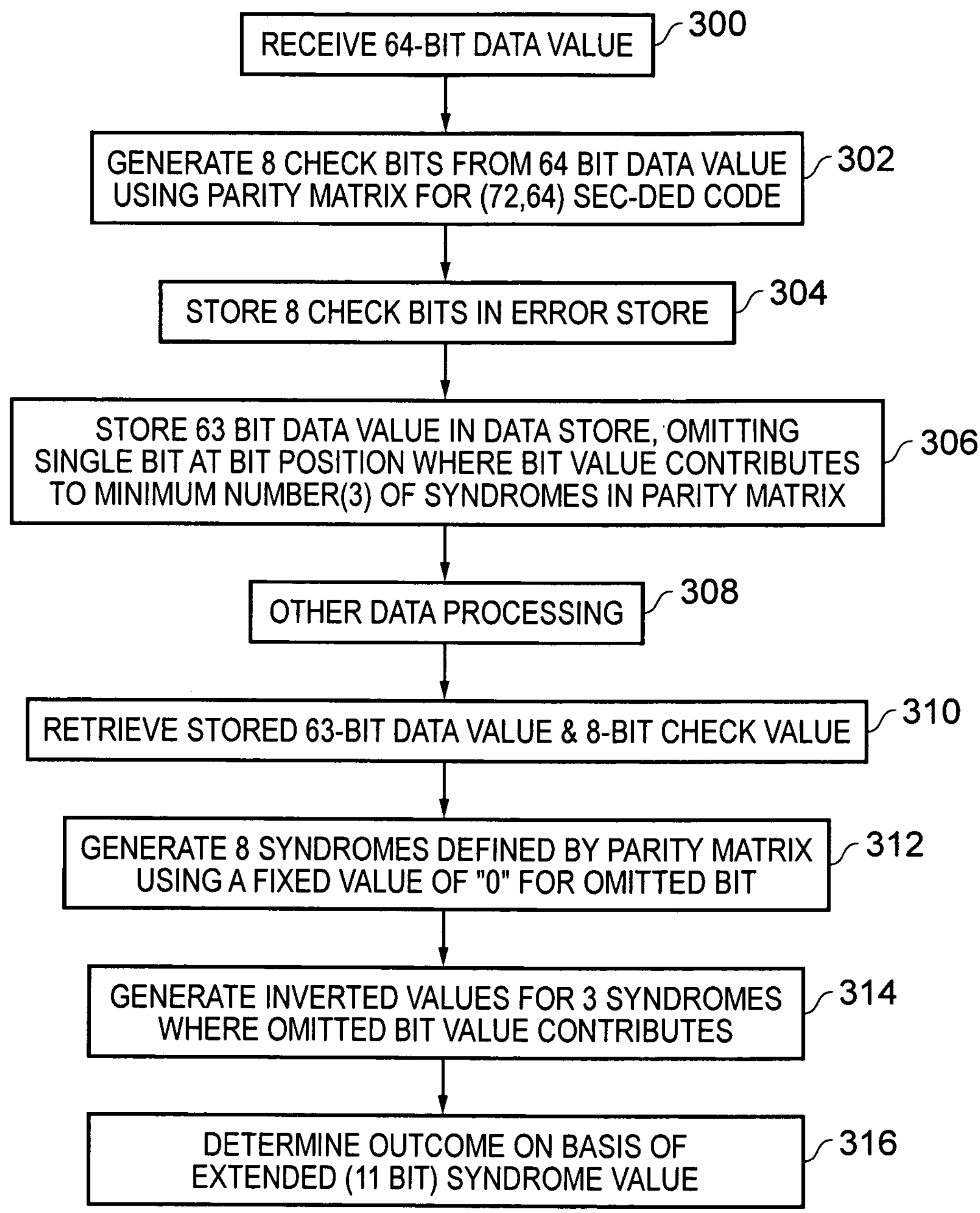
FIG. 7 schematically illustrates a series of steps performed when operating a data processing apparatus such as that illustrated in FIG. 6.

FIG. 7 schematically illustrates a series of steps which are carried out in one embodiment. A 64 bit data value is received at step 300 and at step 302 an 8 bit check value is generated from the 64 bit data value using a parity matrix defined for a (72, 64) SEC-DED coding scheme. This generated 8 bit check value is then stored in an error code store at step 304. At step 306, a 63 bit data value is stored in a data store associated with the error code store, wherein a single bit from the original 64 bit data value is omitted at a bit position where it is known from the parity matrix that the bit value will contribute to a minimum number of syndromes defined by the parity matrix. In this example embodiment the minimum number of syndromes to which a bit value position can contribute is three. Then other data processing takes place at step 308 before the data value is required to be retrieved from the data store. When it is required, the 63 bit data value and its corresponding 8 bit check value are retrieved at step 310 from the data and error code stores respectively. Then at step 312 eight syndrome bit values (forming an 8 bit overall syndrome value) are generated as defined by the parity matrix using an assumed value of "0" for the omitted bit. Then at step 314 inverted values are generated for the three syndrome bit values to which it is known that the omitted bit value contributes as defined by the parity matrix. Then finally at step 316 an overall outcome is determined by the examination of the extended (11-bit) syndrome value comprising the 8 bit syndrome value and the three inverted bits.

Figure 8A:
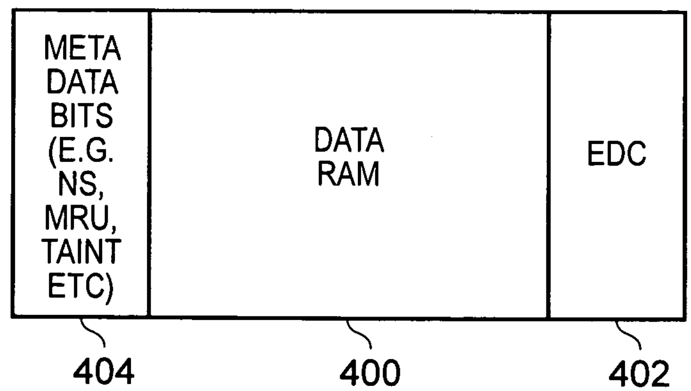
FIG. 8 schematically illustrates the use of the present techniques to implicitly store metadata bits.
Figure 8B:
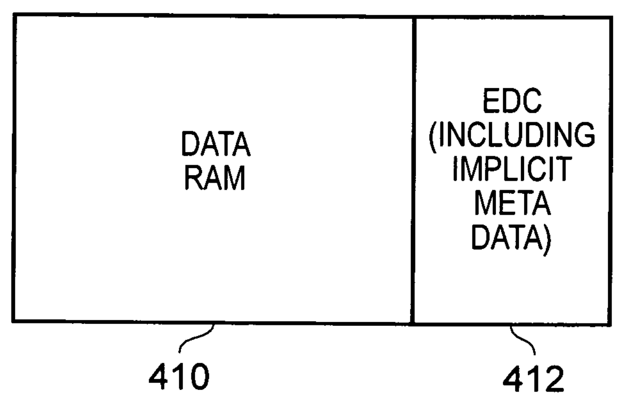

The implicitly stored data bit or bits could take a number of forms. For example, in the embodiments described above, the omitted data bit is described as being part of a received data value, but there has been no discussion of what that data value represents. FIGS. 8A and 8B schematically illustrate how the present techniques may be used to implicitly store meta data bits associated with data values within the EDC values stored in association with the data values. Accordingly FIG. 8A schematically illustrates the situation according to the prior art wherein a data RAM 400 is configured to store data values, whilst an associated EDC store 402 is configured to store error check values associated with the data values stored in the data RAM and meta data bits are stored in meta data store 404. These meta data bits could take a number of forms, for example an NS bit used to indicate a security domain with which the data value is associated, an MRU (most recently used) bit, a taint bit used to mark data values derived from an untrusted source and so on. The present invention is not limited to any particular kind of meta data bits. The storage units 400, 402 and 404 could for example be provided as a cache device wherein meta data, data values and EDC values are stored within a given cache line. FIG. 8B schematically illustrates how the storage structures schematically illustrated in FIG. 8A might be adapted to make use of the present techniques. In particular whilst the data RAM 410 is the same as the data RAM 400, the EDC 412 is now adapted to implicitly store a meta data bit (or meta data bits) associated with a given data value. Accordingly the portion of the storage device (which may for example be a cache device) dedicated to the meta data bits has been subsumed into the EDC store. Note that although an example of a data ram is given in FIG. 8B, the technique is equally applicable to a tag RAM.

Figure 9:
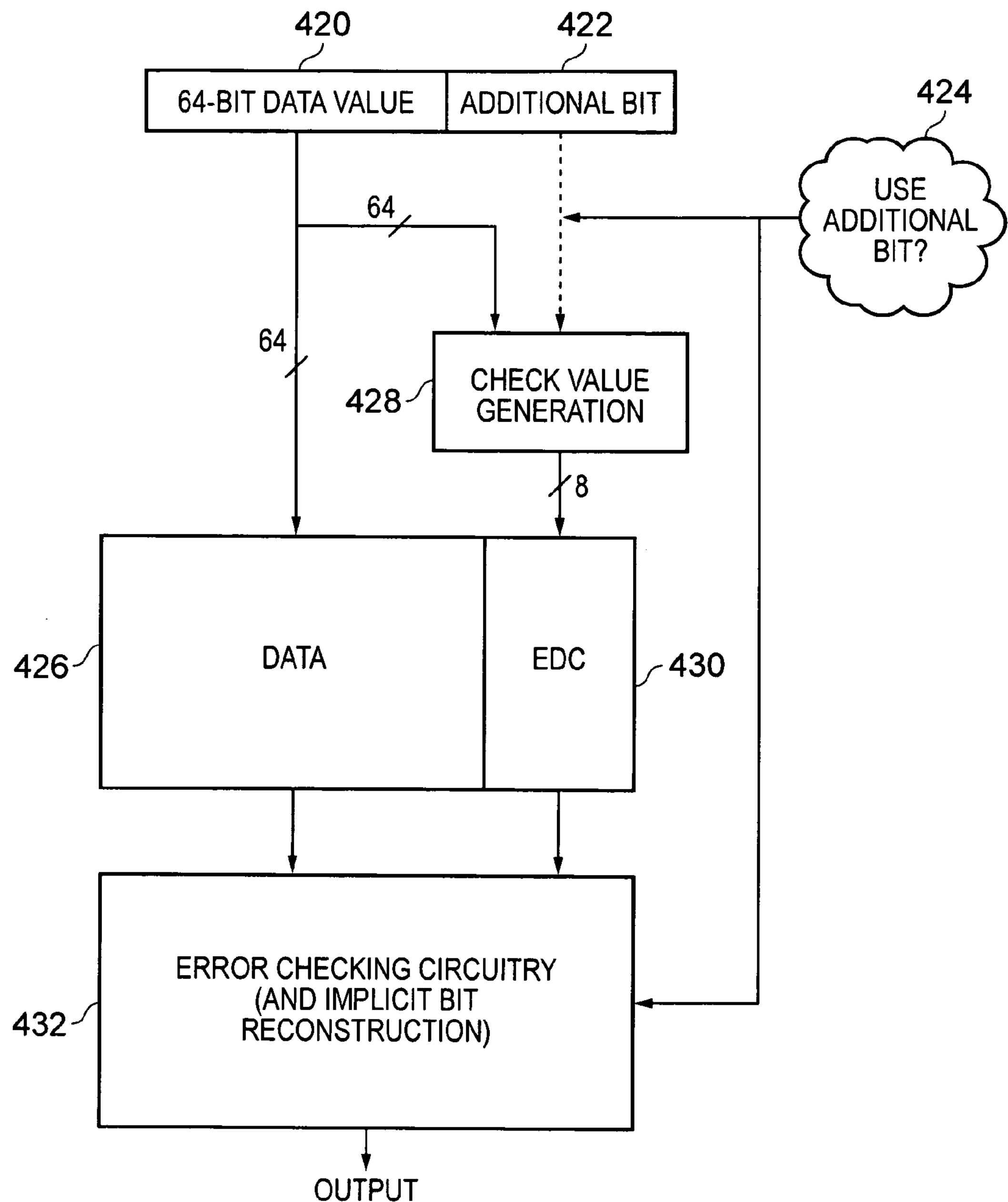
FIG. 9 schematically illustrates an embodiment in which an additional bit may optionally be implicitly stored.

FIG. 9 schematically illustrates another embodiment in which an additional bit may optionally be implicitly stored in association with a data value. This presents an alternative view of the present techniques in which the physical size of a data/EDC store is kept the same (e.g. 72 bits in the example of a 72-64 SEC-DED code based system) but the logical capacity of the storage may be increased. This is schematically illustrated in FIG. 9 by the option to store an additional bit in association with the 64 bit data value. As shown in FIG. 9, a 64 bit data value 420 is received with which an additional bit 422 may be associated. This additional bit is of a type such that it may not always need to be stored in association with the 64 bit data value. Whether or not this additional bit stored is determined by the logic 424 which determines whether to additional bit should be in a particular incidence or not. Logic 424 may for example form part of a CPU controlling (inter alia) the operation of the data EDC stores 426 and 430. For example, the above mentioned taint bit might form the additional bit and the system user may choose when to carry out a taint analysis and when not to. In examples when it is not required to perform the taint analysis, the storage of a taint bit as the additional bit 422 can be switched off in the embodiment schematically illustrated in FIG. 9. The 64 bit data value 420 is stored in the data store 426 and the 64 bits thereof are used by check value generation circuitry 428 to generate an 8 bit check value which is stored in association with the data value in EDC store 430. The check value generation circuitry 428 is configured to receive the additional bit 422 when the selection logic 424 indicates that this should happen. Accordingly, it will be appreciated that when the additional bit is used then the check value generation circuitry 428 is operating according to a 73-65 SEC-DED based scheme, wherein the $65^{th}$ bit is implicitly stored in the 8 bit check value stored in the EDC store 430. Correspondingly, the error checking circuitry 432 is configured to perform normal 72-64 SEC-DED based error checking when the additional bit 422 is not used, and to perform 73-65 SEC-DED based error checking and implicit bit reconstruction according to the present techniques when the additional bit 422 is used (as indicated by the logic 424).

Figure 10:
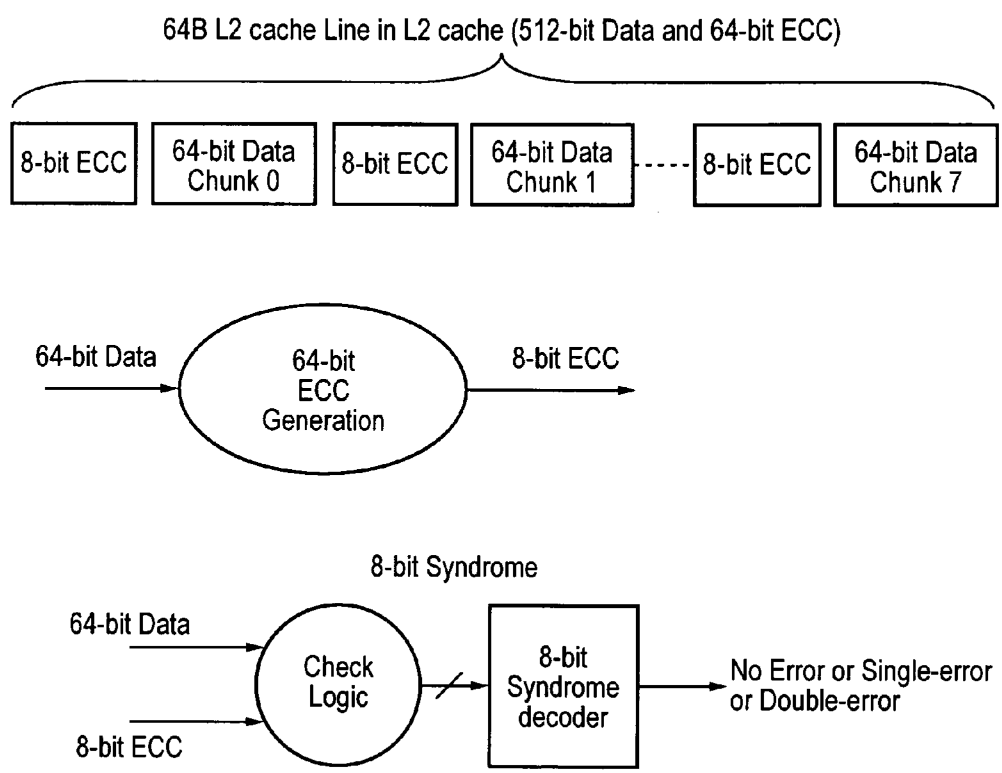
FIG. 10 schematically illustrates the use of a (72, 64) SEC-DED code to protect 64 bit data chunks in a 64B L2 cache line in the prior art.
Figure 11:
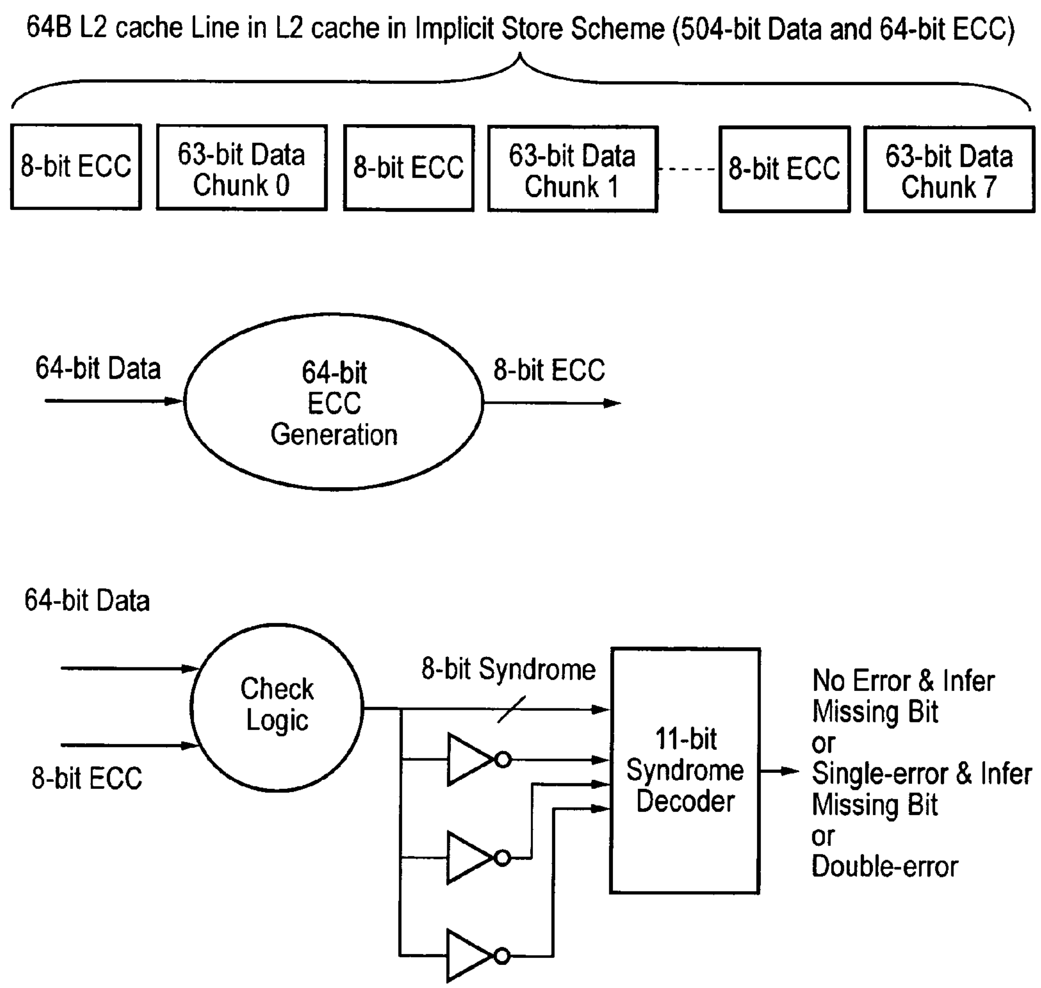
FIG. 11 schematically illustrates the reduction from 512 bit storage in the system shown in FIG. 10 to 504 bit data storage for one embodiment.

FIGS. 10 and 11 schematically illustrate how the present technique may be scaled to larger data values. FIG. 10 schematically illustrates how a 64B L2 cache line in an L2 cache in the prior art may be subdivided into 8 64-bit data chunks each with an associated 8-bit ECC value (aka EDC value). 64-bit ECC generation logic is provided to generate the 8 bit ECC value from each 64 bit data chunk and check logic/ syndrome decoder logic is provided to generate an 8 bit syndrome value from a given 64 bit data chunk and its associated 8 bit ECC value and to determine whether no error, a single error or a double error has occurred.

In order to allow the present techniques to be scaled to apply to larger data values such as a 64B L2 cache line, an approach such as that schematically represented in FIG. 11 may be taken. Here one bit out of each 64-bit data chunk is implicitly stored such that eight 63-bit data chunks are stored in the cache line each having an associated 8 bit ECC value. Accordingly, overall 504 bits of data and 64 bits of ECC values are stored in each cache line as opposed to 512 data bits and 64 ECC bits in the example of FIG. 10. Accordingly 8 bits of data storage are saved per cache line. The same 64 bit ECC generation logic is provided to generate the eight bit ECC values from the original 64 bit data values, but the check logic and syndrome decoder are substituted by components such as those discussed with reference to FIG. 6 wherein the check logic generates an 8 bit syndrome value based on an assumed value for the missing bit and three invertors are provided to generate the three syndrome bit values which would be affected by the alternative possible value for this missing bit (as discussed with reference to FIG. 6.) The resulting 11 bit syndrome value is then decoded to determine if any errors have occurred and if the missing bit can be inferred. The check logic and syndrome decoder need only be provided once in the system to handle one 64 bit data value and associated 8 bit ECC value at a time and accordingly in a cache implementation such as that schematically illustrate in FIG. 11 8 bits of data storage per cache line may be saved at the cost of providing three extra invertors and an 11 bit syndrome decoder as opposed to an 8 bit syndrome decoder.

Figure 12:
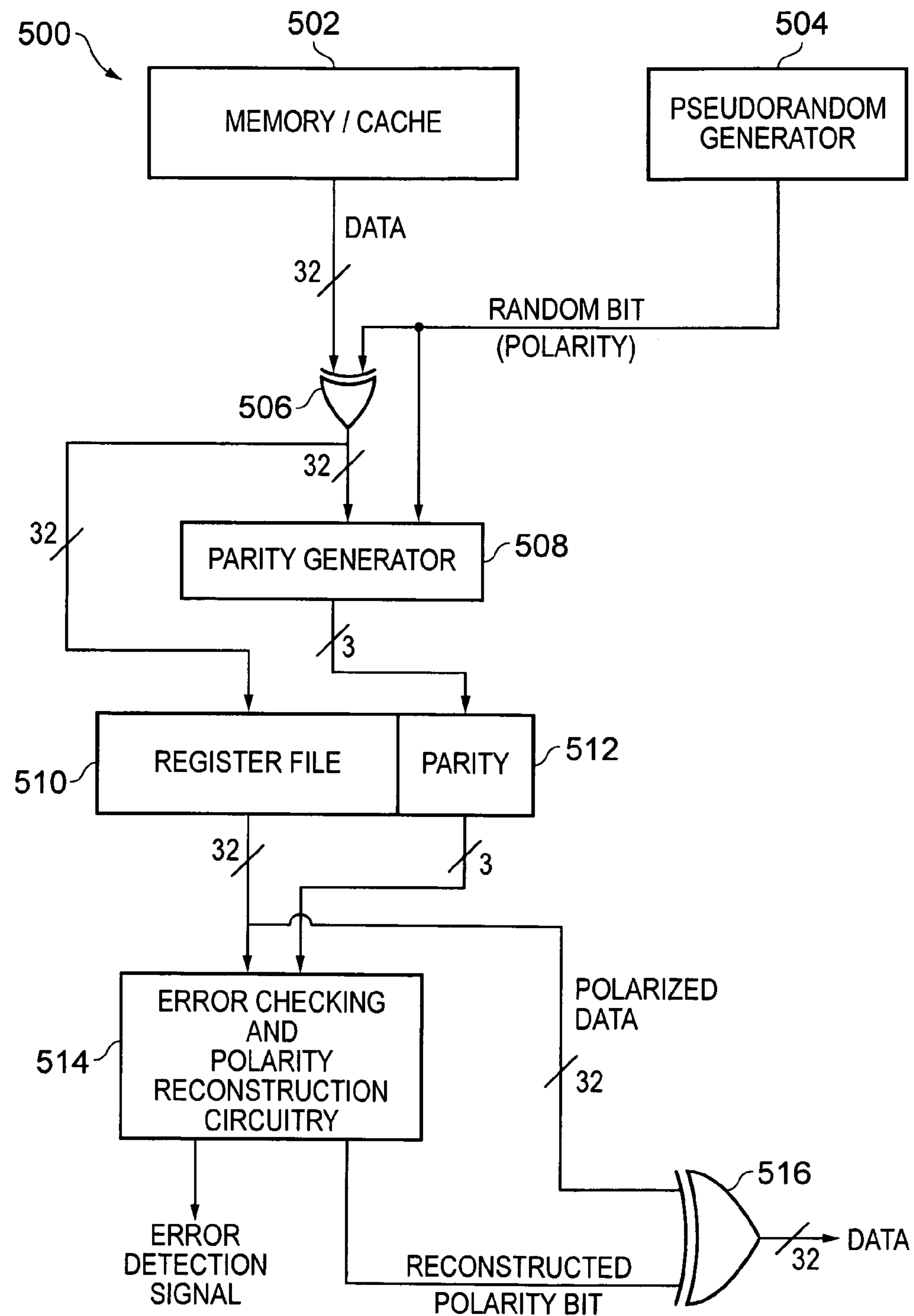
FIG. 12 schematically illustrates a data processing apparatus using a randomly generated polarity bit to "polarise" a stored data value and the use of the present techniques to implicitly store that polarity bit within associated parity bits according to one embodiment.

FIG. 12 schematically illustrates another embodiment. A data processing apparatus 500 is shown which comprises a data store 502 (which may for example be a memory or a cache). For security related purposes, a data value retrieved from the data store 502 is not used unamended within the data processing apparatus 500 but a pseudo random number generation 504 is provided which is configured to provide a random bit value (also referred to herein as a polarity value) each time a data value from the data store is retrieved. The data value retrieved from the data store 502 is then subjected to an XOR function 506 which takes the data value and the randomly generated polarity bit as its inputs. The output of this XOR operation 506 is then provide to parity generator 508 and the output is also provided to register file 510 where this value is temporarily stored. Accordingly the "raw" data value retrieved form the data store 502 is not necessarily stored unamended in the register file 510, but may (in dependence on the polarity bit value) be stored in an "encrypted" (i.e. polarised) form. This enhances the security of the data processing apparatus 500 against malicious attacks.

The parity generator 508 is configured to generate parity bits in dependence on the "polarised" 32-bit data value it receives and the polarisation bit itself. In this example embodiment parity generator 508 generates 3 parity bits according to the scheme illustrated in FIG. 13 and discussed in more detail below. Whilst the polarised 32-bit data value is stored in the register file 510, the 3 bits of parity data are stored in association therewith in the associated parity store 512. Accordingly it can be seen that the polarity bit generated by the pseudo random number generator 504 has not been explicitly stored, but rather is implicitly stored within the parity bits stored in association with the polarised data value. Later, when the data value is accessed, the polarised data value is retrieved from the register file 510 and its associated parity bits are retrieved from the parity store 512. These are passed to the error checking and polarity reconstruction circuitry 514 which is configured to determine if any bit changes have occurred within the stored data value and parity bits, and further to reconstruct the polarity bit implicitly stored within the parity bits. If the error checking circuitry 514 determines that a bit change has occurred then an error detection signal is asserted. Conversely if no bit changes are detected then the polarity reconstruction circuitry 514 is configured to reconstruct the polarity bit on the basis of the received 32-bit polarised data value and the three bit parity value. The reconstructed polarity bit is output and passed to the XOR gate 516 which also receives the polarised 32-bit data value from the register file 510. The XOR gate 516 then performs an XOR function on the polarised data value and the reconstructed polarity bit to reconstruct the original 32-bit data value that was retrieved from the data store 502. Further detail of the polarity bit and the reconstruction thereof are discussed with reference to the following FIGS. 13 and 14.

FIG. 13 illustrates one scheme by which three parity bits may be generated from a 32-bit data value and an associated polarisation bit. According to the definition set out in FIG. 13 the respective parity bits are generated by an XOR function which takes the bits indicated by an "X" as inputs. Accordingly, it can be seen that all three parity bits depend on the polarisation bit and that each parity bit depends on a different subset of bits of the 32-bit data value. Although in principal a parity value could be generated using the polarisation bit and all bits of the 32-bit data value, this approach would be more vulnerable to some types of random fault (for example caused by an ionising particle strike) or by fault injections (introduced by a malicious attacker). By spreading out the subsets of bits which the respective parity bits depend on a greater resistance to different types of bit changes within the 32-bit data value is provided. For example, in the scheme proposed in FIG. 13, single, double consecutive and triple consecutive errors in the 32-bit data value can be detected (although not four consecutive bit errors).

Figure 14:
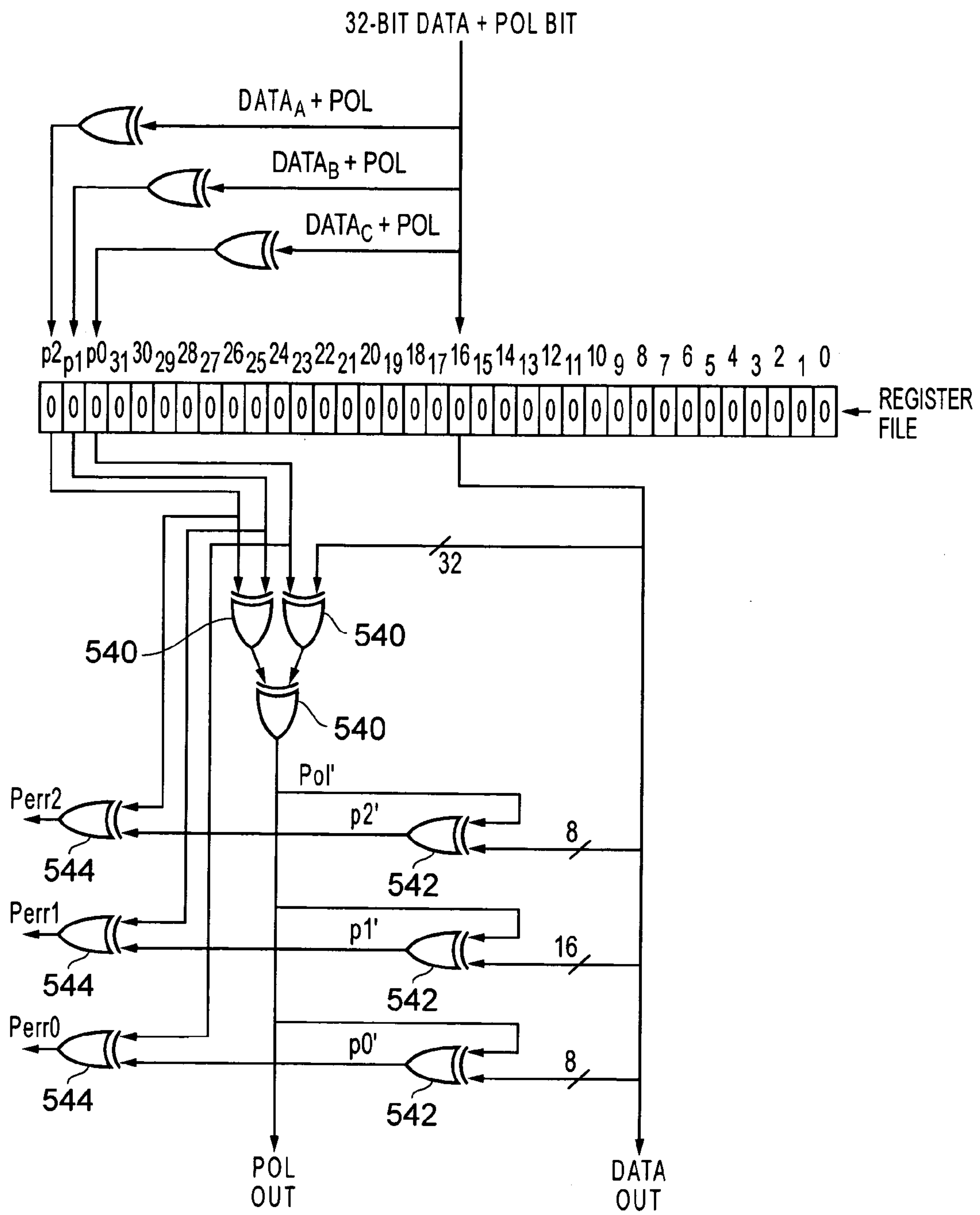
FIG. 14 schematically illustrates the storage and reconstruction of parity bits, data bits and a polarity bit for a system such as that illustrated in FIG. 12 and a parity bit definition such as that illustrated in FIG. 13.

FIG. 14 schematically illustrates one configuration for the parity generator 508 and error checking and polarity reconstruction circuitry 514 shown in FIG. 12. The parity generation circuitry is provided by the three XOR functions illustrated above the register file in FIG. 14. Each of these receives a subset of the 32-bit data value and the polarisation bit. $DATA_A$, $DATA_B$ and $DATA_C$ are labelled in FIG. 13 to indicate the relevant subsets of data bits in the 32-bit data value. It can be seen that $DATA_A$ is an 8-bit subset, $DATA_B$ is a 16-bit subset and $DATA_C$ is an 8-bit subset The XOR function performed on these inputs generate the three parity bits which are stored in association with the 32-bit data value in the register file. When the register file is accessed the 32-bit data value and three bit parity value are passed to the error checking and polarity reconstruction circuitry 514 (see FIG. 12) which is represented in FIG. 14 by the components below the register file. The 32-bit data value is combined with the 3 bit parity value by the concatenated XOR functions 540 to generate a reconstructed polarisation value pol'. The respective subsets of the read out 32-bit data value ($DATA_A$, $DATA_B$ and $DATA_C$) are also passed to the XOR functions 542 which each receive one of these subsets of the 32-bit data value together with the reconstructed polarity bit pol' in order to generate reconstructed parity bits p0', p1' and p2'. These reconstructed parity bits can then compared with the read out parity bits p0, p1 and p2 by means of the XOR functions 544 to indicate if an error has been detected in the set of values protected by these respective parity bits. If any of Perr0, Perr1 or Perr2 are asserted then this constitutes an error detection signal as shown in FIG. 12 and enables a determination of which subset of bits within the 32-bit data value registered an error. Accordingly, it will be appreciated that the polarity bit, which is of great significance to the security of the data handled by the data processing apparatus 500, is not explicitly stored in the register file 510 (or its associated parity portion 512) but rather is implicitly stored within the parity values generated and stored. Accordingly the implementation cost for using a randomly generated polarity bit to "encrypt" the data values read out from the data store 502 and temporarily stored in the register file 510 is reduced since the polarity bit does not need to be explicitly stored. Furthermore, the security of the system is enhanced because the critical polarity bit is not explicitly stored within the system, where it might be vulnerable to an intruder.

Although particular embodiments of the invention have been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. A data processing apparatus comprising:

error code generation circuitry configured to generate an error code associated with a received data value, said error code being constructed such that a bit change in said received data value can be known about by reference to said error code;

a data store in which stored data values are stored;

an error code store in which associated error codes corresponding to said stored data values are stored; and error checking circuitry configured to perform a verification operation on a stored data value and an associated error code to determine if an error has occurred in at least one of said stored data value and said associated error code during storage, wherein said received data value comprises at least one additional bit with respect to said stored data value and wherein said error checking circuitry is configured to reconstruct said at least one additional bit by reference to said stored data value and said associated error code.

2. The data processing apparatus as claimed in claim 1, wherein said error code comprises an error correction code, wherein said error correction code is constructed such that said bit change in said received data value can be corrected by reference to said error correction code.

3. The data processing apparatus as claimed in claim 2, wherein said error correction code is a single error correction double error detection (SEC-DED) code.

4. The data processing apparatus as claimed in claim 2, wherein said error checking circuitry is configured to perform said verification operation using said error correction code and alternative values for said at least one additional bit in order to reconstruct where possible said at least one additional bit.

5. The data processing apparatus as claimed in claim 4, wherein said error checking circuitry is configured to determine an outcome, on the basis of said verification operation, said outcome selected from the group comprising:

a) no bit change has occurred and said at least one additional bit can be reconstructed;

b) said bit change has occurred, said bit change is correctable and said at least one additional bit can be reconstructed; and c) said bit change has occurred, said bit change is not correctable and said at least one additional bit cannot be reconstructed.

6. The data processing apparatus as claimed in claim 4, wherein said error checking circuitry is configured to perform multiple verification operations, each verification operation corresponding to each alternative value of said at least one additional bit.

7. The data processing apparatus as claimed in claim 6, wherein said error checking circuitry is configured to perform said multiple verification operations sequentially.

8. The data processing apparatus as claimed in claim 6, wherein said error checking circuitry is configured to perform said multiple verification operations in parallel using replicated checking circuitry.

9. The data processing apparatus as claimed in claim 2, wherein said verification operation is performed with reference to a parity check matrix, said parity check matrix defining a plurality of syndromes, each syndrome of said plurality of syndromes defining a parity value determined for a selected subset of bits of said received data value and a selected bit of said error code, wherein said, selected bit of said error code is a parity value of said selected subset of bits of said received data value, and wherein said parity check matrix is defined such that parity values determined for said plurality of syndromes enable identification of a bit position where said bit change occurred.

10. The data processing apparatus as claimed in claim 9, wherein said error checking circuitry is configured to perform said verification operation assuming a predetermined value of said at least one additional bit and said error checking circuitry further comprises at least one inverter configured to additionally generate an inverted parity value for each syndrome for which said selected subset of bits comprises said at least one additional bit.

11. The data processing apparatus as claimed in claim 10, wherein said at least one additional bit in said received data value is at a chosen bit position which contributes to a minimum number of syndromes in said plurality of syndromes.

12. The data processing apparatus as claimed in claim 1, wherein said error code comprises at least one parity bit, said at least one parity bit indicative of a parity value of at least part of said received data value, wherein said at least part of said received data value includes said at least one additional bit.

13. The data processing apparatus as claimed in claim 12, wherein said error code comprises a plurality of parity bits, wherein each parity bit of said plurality of parity bits is indicative of an individual parity value of an individual subset of bits within said received data value, wherein each said individual subset of bits includes said at least one additional bit.

14. The data processing apparatus as claimed in claim 1, wherein said at least one additional bit comprises a polarity bit, said polarity bit indicative of a polarity of data bits forming at least part of said received data value, wherein values of said data bits when said polarity bit has a first value are complementary to values of said data bits when said polarity bit has a second value.

15. The data processing apparatus as claimed in claim 1, wherein said at least one additional bit comprises a data value bit, wherein said received data value comprises a plurality of data value bits which together form a unitary data value which is subject to data processing in said data processing apparatus, and wherein said data value bit is comprised within said plurality of data value bits.

16. The data processing apparatus as claimed in claim 1, wherein said at least one additional bit comprises a metadata bit, wherein said received data value comprises a plurality of data value bits which together form a unitary data value which is subject to data processing in said data processing apparatus, and wherein said metadata bit configures at least one aspect of said data processing.

17. The data processing apparatus as claimed in claim 1, wherein said data store is selected from the group comprising a register file, a cache, a memory, a translation lookaside buffer and a branch target buffer.

18. The data processing apparatus as claimed in claim 1, wherein said error code store forms part of said data store.

19. The data processing apparatus as claimed in claim 1, wherein data processing apparatus further comprises control circuitry configured to switch said data processing apparatus into a non-implicit-storage mode in which said received data value comprises no additional bits with respect to said stored data value and which said error checking circuitry is configured not to seek to reconstruct said at least one additional bit by reference to said stored data value and said associated error code.

20. A data processing apparatus comprising:

error code generation means for generating an error code associated with a received data value, said error code being constructed such that a bit change in said received data value can be known about by reference to said error code;

data store means for storing stored data values;

error code store means for storing associated error codes corresponding to said stored data values; and error checking means for performing a verification operation on a stored data value and an associated error code to determine if an error has occurred in at least one of said stored data value and said associated error code during storage, wherein said received data value comprises at least one additional bit with respect to said stored data value and wherein said error checking means for reconstructing said at least one additional bit by reference to said stored data value and said associated error code.

21. A method of processing data comprising the steps of:

generating an error code associated with a received data value, said error code being constructed such that a bit change in said received data value can be known about by reference to said error code;

storing stored data values a data store;

storing in an error code store associated error codes corresponding to said stored data values;

performing a verification operation on a stored data value and an associated error code to determine if an error has occurred in at least one of said stored data value and said associated error code during storage, wherein said received data value comprises at least one additional bit with respect to said stored data value; and reconstructing said at least one additional bit by reference to said stored data value and said associated error code.

* * * * *